United States Patent [19]

Frentzel

[11] Patent Number: 5,200,264
[45] Date of Patent: Apr. 6, 1993

[54] THERMOSET POLYMER THICK FILM COMPOSITIONS AND THEIR USE AS ELECTRICAL CIRCUITRY

[75] Inventor: Richard L. Frentzel, Chino Hills, Calif.

[73] Assignee: Advanced Products, Inc., Cheshire, Conn.

[21] Appl. No.: 716,187

[22] Filed: Jun. 17, 1991

Related U.S. Application Data

[62] Division of Ser. No. 403,235, Sep. 5, 1989, Pat. No. 5,049,313.

[51] Int. Cl.$^5$ ............................................... B32B 5/16
[52] U.S. Cl. .................... 428/323; 252/503; 252/511; 252/514; 428/402; 428/423.7; 428/425.9; 428/689; 428/901; 430/313; 430/315
[58] Field of Search ................. 428/402, 423.1, 423.7, 428/425.9, 323, 500, 689, 901; 252/502, 503, 510, 511, 512, 514; 430/313, 315

[56] References Cited

U.S. PATENT DOCUMENTS

| 4,391,742 | 7/1983 | Steigerwald et al. | 252/512 |
| 4,481,258 | 10/1984 | Sattler et al. | 428/371 |
| 4,547,311 | 10/1985 | Suko et al. | 252/511 |
| 4,696,764 | 9/1987 | Yamazaki | 252/503 |
| 4,876,033 | 10/1989 | Dzuiria et al. | 252/511 |
| 4,877,554 | 10/1989 | Honma et al. | 252/511 |
| 4,999,136 | 3/1991 | Su et al. | 252/512 |
| 5,006,575 | 4/1991 | Chan | 523/458 |
| 5,011,627 | 4/1991 | Lutz et al. | 252/512 |
| 5,112,687 | 5/1992 | Frentzel et al. | 428/402 |

Primary Examiner—Paul J. Thibodeau
Assistant Examiner—Hoa T. Le
Attorney, Agent, or Firm—William A. Simons

[57] ABSTRACT

A thermally curable conductive polymer thick film composition comprising an uncured admixture of:
(a) a resin system comprising an admixture of:
  (i) about 4.50 parts to about 12 parts by weight of at least one phenoxy resin; and
  (ii) about 6 parts to about 15.5 parts by weight of at least one blocked polyisocyanate resin; and
(b) a particulated electrically conductive material selected from the group consisting of:
  (i) about 50 parts to about 70 parts by weight silver flake; and
  (ii) a mixture of about 15 parts to about 25 parts by weight graphite and about 3 parts to about 6 parts by weight carbon black.

6 Claims, No Drawings

THERMOSET POLYMER THICK FILM COMPOSITIONS AND THEIR USE AS ELECTRICAL CIRCUITRY

This is application is a division of application Ser. No. 07/403,235, filed Sep. 5, 1989, now U.S. Pat. No. 5,049,313 which issued on Sep. 17, 1991.

This invention relates to selected curable and cured thermoset polymer thick film (PTF) compositions and their use, when cured, as electronic circuitry and the like. More particularly, this invention relates to selected single-component curable PTF compositions that have a relatively long shelf life at room temperature (i.e., more than six months) and are curable at relatively low temperature and short times (i.e., at about 125° C.–140° C. over about 30–60 minutes). Still further, this invention relates to selected cured PTF compositions which exhibit good flexibility, have good abrasion and solvent resistance, have acceptably good adhesion to a substrate as well as are stable at high temperatures (e.g. about 300° C.) for short periods of time.

Thermoset polymer thick films have been used as screen-printed electronic circuitry on a substrate material for various electronic applications such as jumpers on printed wiring boards, key pads for computers and typewriters and the like. These prior art polymer thick film compositions have preferred to use thermoset polymers in them rather than thermoplastic polymers because the former are more solvent resistant as well as high temperature stable. The latter property is particularly needed when the PTF-coated substrate is subjected to high temperature solder bath (i.e., about 300° C. for up to 30 seconds), after the PTF application step.

Prior art thermoset PTF compositions have generally consisted of epoxy resin or mixture of resins, a curative (e.g. dicy) and a catalyst (e.g. urea). Presently the commercially available thermoset PTF compositions exhibit either a long shelf life at room temperature (i.e., over six months) and require a high temperature cure (i.e., about 160° C. or higher) or exhibit a short pot life (i.e., about two weeks) and a lower temperature cure (i.e., about 125°–140° C.).

Ideally, a thermoset PTF composition should possess the following combination of properties:
(1) exhibit a relative long pot life at room temperature (i.e., at least six months);
(2) require a low curing temperature and short curing times (i.e., no higher than 125° C. to 140° C. for no longer than 60 seconds);
(3) be sufficiently conductive (or have low electrical resistivity) to carry an electric current;
(4) be sufficiently flexible when cured to be applied to flexible substrate (or substrates which might flex during their operation);
(5) have good abrasion resistance when cured so that they do not easily get rubbed or scratched off the substrate;
(6) have acceptably good adhesion to the substrate when cured;
(7) be stable at relatively high temperatures (at about 300° C.) for short period of time such as those employed in solder bath treatments);
(8) be easily prepared; and
(9) be inexpensively applied to a substrate and cured without needing a complicated procedure.

The PTF compositions of the present invention, unlike the prior art PTF compositions, are believed to have this combination of properties.

Accordingly, the present invention is directed to a thermally curable thermoset polymer thick film composition comprising by weight:
(a) a resin system comprising an admixture of:
  (i) about 4.50 parts to about 12 parts by weight of at least one phenoxy resin; and
  (ii) about six parts to about 15.5 parts by weight of at least one blocked isocyanate resin; and
(b) a particulated electrically conductive material selected from the group consisting of:
  (i) about 50 parts to about 70 parts by weight silver flake; and
  (ii) a mixture of about 15 parts to about 25 Parts by weight graphite and about 3 parts to about 6 parts by weight carbon black.

Furthermore, the present invention is also directed to a method of preparing a polymer thick film on a substrate comprising the steps of:
(1) providing a Polymer thick film composition as defined above;
(2) applying said composition to a substrate; preferably flexible; and
(3) curing said composition on said substrate.

Still further, the present invention is directed to cured polymer thick film composition comprising by weight:
(a) a cured resin system comprising a reaction product of:
  (i) about 4.50 parts to about 12 parts by weight of at least one phenoxy resin; and
  (ii) about 6 parts to about 15.5 Parts by weight of at least one blocked polyisocyanate resin; and
(b) a particulated electrically conductive material selected from the group consisting of:
  (i) about 50 parts to about 70 Parts by weight silver flake; and
  (ii) an admixture of about 15 parts to about 25 parts by weight graphite and about 3 parts to about 6 parts by weight carbon black.

And even further, the present invention is directed to a substrate having a cured conductive polymer thick film coating thereon as defined above.

As stated above, the present invention encompasses the combination in a polymer thick film composition made up of three different components: a resin system made from two different types of resins, namely, a phenoxy resin and a blocked isocyanate resin and a Particulated electrically conductive material which is either silver flake or a mixture of graphite and carbon black.

The phenoxy resin component is preferably made from bisphenol-A and epichlorohydrin. The preferred phenoxy resins of the Present invention also do not have terminal, highly reactive epoxy groups and are thermally stable materials with a long shelf life. The most preferred phenoxy resins are BAKELITE PKHH and PKHC available from Union Carbide Corporation of Danbury, Conn. Mixtures of Phenoxy resins may be used, if desired.

The preferred amount of phenoxy resin is from about 5 parts to about 11.5 parts by weight added into the curable PTF composition.

The "blocked polyisocyanate resin" used in the present invention is a polyisocyanate resin having blocking groups over the isocyanate functions in the molecule. Upon heating, in the presence of other reactive species (e.g., phenoxy resin), the "blocking group" leaves the isocyanates and the free isocyanate function may react with the other reactive species (e.g., the phenoxy resin). Blocked polyisocyanate resins are described in greater detail in a paper presented by Potter, T. A.; Rosthauser, J. W.; and Schmelzer, H. G. entitled "Blocked Isocyanates In Coatings" at the Eleventh International Conference in Organic Coatings Science & Technology Jul. 12-16, 1985 Athens, Greece. This Paper is incorporated herein by reference in its entirety.

The preferred blocked polyisocyanate resin is a blocked aliphatic polyisocyanate made from hexamethylene di-isocyanate (HDI). The most preferred blocked polyisocyanate resin is DESMODUR BL-3175A available from Mobay Corporation of Pittsburgh, Pa. Mixtures of blocked polyisocyanates may be used, if desired.

The amount of blocked polyisocyanate resin is preferably from about 6.5 parts to about 15 parts by weight of said blocked polyisocyanate resin.

The particulated electrically conductive material may be either silver flake or a mixture of graphite and carbon black. This conductive material component should provide stable conductivity under a wide variety of environmental conditions and, preferably, should also be capable of forming relatively stable dispersion. The particle size of the particulate conductive material does not have to be in critical narrow range, but should be of a size appropriate to the substrate and end-use for which they are to be applied, which is usually screen printing. Thus, the conductive phase materials should be no bigger than 30 microns ($\mu$m) and preferably should be below about 10 microns. As a practical matter, most available silver flake graphite and carbon black have average particle sizes less than 30 microns.

The most preferred silver flake is METZ 56 silver flake available from Metz Metallurgical Corporation of South Plainfield, N.J.

The most preferred graphite is HPN-2 graphite flake available from Dixon Ticonderoga Company of Lakehurst, N.J.

The most preferred carbon black is Vulcan XC-72R available from Cabot Corporation of Boston, Mass.

The particulate electrically conductive material is preferably about 55 Parts to about 68 parts by weight silver flake or a mixture of about 18 parts to about 22 parts by weight graphite and about 4 parts to about 5 parts of carbon black.

The curable PTF composition of the present invention may preferably also contain other minor ingredients. Such preferable ingredients include solvents, polymerization catalysts, and flow aids.

If employed, the solvent component of the present invention is preferably a nonhydrocarbon polar solvent which is capable of substantially dissolving the resin component and adjusting the viscosity of the curable PTF composition. The most preferred solvents include diethylene glycol monoethyl ether acetate ("carbitol acetate"); diethylene glycol monobutyl ether acetate ("butyl carbitol acetate"); and mixtures of diethylene glycol monoethyl ether ("carbitol") and dibasic ester solvent.

The minimum preferred amount of solvent, when employed, is a sufficent amount to substantially dissolve the resin composition.

Preferably, the amount of solvent, if employed, is from about 16 parts to about 60 parts by weight of the curable polymer thick film composition. More preferably, the curable PTF composition may contain about 2 parts to about 5 parts by weight of carbitol and about 15 parts to about 58 parts by weight of dibasic ester solvent or about 15 parts to about 55 parts by weight of carbitol acetate or butyl carbitol acetate.

Another preferred component is an a polymerization catalyst. Two preferred polymerization catalysts are toluene sulfonic acid and an amine organo tin catalyst. The primary function of this catalyst is to facilitate the reaction between the hydroxyl group in the phenoxy resin and the isocyanate ring moieties in the blocked polyisocyanate resin during the curing steps.

If used, the polymerization catalyst is preferably employed in amounts from about 0.05 parts to about 0.5 parts.

Another optional ingredient, in the curable PTF composition, is a flow additive. Three preferred types of flow additives are silicon polymers, ethyl acrylate/2-ethylhexyl acrylate copolymers, and an alkylol ammonium salt of acidic phosphoric acid esters of ketoxime. Mixtures of flow agents may be employed.

If used, the flow additive is preferably employed in amounts from about 0.5 parts to about 2 parts by weight.

The components of the present conductive PTF composition may be mixed together by any conventional means. Preferably, it is desirable to first mix the phenoxy resin or resins with the solvent or solvent in a conventional agitated mixing apparatus. This is preferably followed by adding the blocked isocyanate resin and the conductive material as well as any minor preferred components to the apparatus while continuing the agitation. After the last component has been added, the agitation should be continued until a uniform mixture is obtained. This mixture may than be preferably placed in a three-roll mill or another suitable milling machine to obtain a fineness of grind of the composition of under about 30 microns.

The compositions of this invention may be applied to substrates by a variety of techniques, such as screen printing, spraying, or brushing. Once the conductive PTF composition has been applied to the substrate, it is dried and cured by exposing it and the substrate to elevated temperatures one or more times. The preferred curing is at temperatures from about 120° C. to about 150° C. for times from about 90 minutes to 20 minutes. Any conventional PTF curing apparatus may be used.

When the mixture of phenoxy resin or resins and block polyisocyanate resin are thermal cured, it is believed that blocked isocyanate groups are deblocked and thus reactive with hydroxyl group in the phenoxy resins to form a thermoset polymer having urethane linkage. This reactive mechanism is not fully understood and the present invention should be limited to any particular reaction mechanism.

The conductive composition of the present invention may be applied to conventional rigid or flexible substrates. Whether the substrate is flexible or rigid in nature, the substrate may or may not have to be pretreated or precoated with any other substance before applying the present compositions.

The conductive compositions of the present invention are flexible and as such, they may be applied to a flexible substrate such as, for example, polyimide films. Examples of flexible substrates that an be coated with the conductive compositions of the present invention are polyimide substrates such as that made by E. I. DuPont de Nemours Company and sold under the trademark Kapton ®. Of course, other flexible materials such as polycarbonate film or polyvinyl fluoride (PVF) film may be used as a flexible substrate.

The term "flexible" as presently employed in this specification and claims is used to mean when the composition of the present invention may be subjected to deformative forces (e.g., twisting or bending) and will not release from the substrate or crack or break. The composition, in its deformed state, will function as well as the composition in its undeformed state. The most severe form of deformation would be to put a crease in the composition. This may be accomplished by a 180 degree angle fold of the composition and substrate. A flexible composition like those of the present invention will function well under this condition. If the composition cracks or breaks as the result of being distorted, the composition would not be considered flexible; cracks in the composition cause a severe decrease in conductivity and other electrical and mechanical properties.

The following Examples are shown to better illustrate the present invention. All parts and percentages are by weight unless otherwise explicitly stated.

EXAMPLE 1

A conductive dispersion was formed by first dissolving a phenoxy resin in a solvent mixture of diethylene glycol monoethyl ether, and dibasic ester solvent using a propeller-agitated mixer and then adding thereto a blocked isocyanate resin, toluene sulfonic acid, and a silicon polymer flow additive. Silver flake was then added into the mixer and resultant mixture was agitated in the propeller-agitated mixer for about one minute. These seven components were mixed in a three-roll mill until a fineness of grind of 13 microns was obtained. This ground dispersion was then removed from the mill and tested as discussed below. The seven components and their parts by weight are given in the following Table 1.

TABLE 1

| Component | Parts by Weight |
| --- | --- |
| Phenoxy Resin (1) | 5.54 |
| Diethylene Glycol Monoethyl Ether (2) | 2.55 |
| Dibasic Ester Solvent (3) | 21.13 |
| Blocked Isocyanate (4) | 7.24 |
| Toluene Sulfonic Acid | 0.11 |
| Silicon Polymer Flow Additive (5) | 0.99 |
| Silver Flake (6) | 62.44 |
| | 100.00 |

(1) BAKELITE PKHH Phenoxy Resin available from Union Carbide Corp. of Danbury, CT.
(2) Also known as carbitol available from Union Carbide Corp. of Danbury, CT.
(3) Also known as DBE available from DuPont of Wilmington, DE.
(4) DESMODUR BL-3175A Blocked Isocyanate Resin available from Mobay Corporation of Pittsburgh, PA.
(5) CARE 16 available from Advance Process Supply of Chicago, IL.
(6) METZ 56 available from Metz Metallurgical Corp. of South Plainfield, NJ 07080.

This uncured dispersion was found to have the following properties:

| | |
| --- | --- |
| Viscosity (Brookfield RVT, 20 rpm, Spindle No. 6, 30° C.): | 12,000 cps. |
| Solids Content: | 74% by weight |
| Density: | 19 lbs./gallon |
| Shelf Life (at 25° C.): | Greater than 6 months |

The viscosity of 12,000 cps means that this conductive dispersion is easily screen printable for its intended end uses. The solid contents means the amount of solid components in the dispersion (everything other than the solvent).

After the above-noted mixing steps, the resulting dispersion was screen printed onto a phenolic-type printed wiring board (FR-2) or an epoxy glass-type printed wiring board (FR-4). The screen used was a polyester filament type of −230 mesh size. The screened dispersion was cured in a convention oven for either 30 minutes at 140° C. or 60 minutes at 125° C. The solvent resistance (i.e., number of rubs of a methylethyl ketone saturated paper towel across the cured pattern necessary to dissolve the cured dispersion) and surface resistivity (i.e., ohms per square at 1 mil) were measured. These results are as follows:

| Cure Condition | MEK Rubs | Surface Resistivity |
| --- | --- | --- |
| 125° C./60 Mins. | >100 | 0.018 |
| 140° C./30 Mins. | >100 | 0.015 |

These results show that this cured PTF dispersion was highly resistant to solvent attack and has a high electrical conductivity, even after curing at low temperatures.

The pencil hardness of this cured PTF dispersion was also measured to be 9H, which is relatively very heard. This cured system also was found to be very flexible since no cracking or adhesion loss was observed when either the phenolic-type or epoxy glass-type boards were bent or flexed.

EXAMPLE 2

A conductive dispersion was formed by first dissolving a different phenoxy resin in diethylene glycol monobutyl ether acetate using a propeller-agitated mixer and then adding a blocked isocyanate resin, toluene sulfonic acid and a silicon polymer flow additive. Silver flake was then added into the mixer and resultant mixture was agitated in the propeller-agitated mixer for about one minute. These six components were mixed in a three-roll mill until a fineness of grind of 13 microns was obtained. This ground dispersion was then removed from the mill and tested as discussed below. The six components and their parts by weight are given in the following Table 2.

The uncured dispersion was found to have a shelf life of greater than six months at room temperature (i.e. about 25° C.). This relative long shelf life is highly desirable for a PTF product.

TABLE 2

| Component | Parts by Weight |
| --- | --- |
| Phenoxy Resin (7) | 5.07 |
| Diethylene Glycol Monobutyl Ether Acetate (8) | 29.70 |
| Blocked Isocyanate (4) | 6.60 |
| Toluene Sulfonic Acid | 0.10 |
| Silicon Polymer Flow Additive (5) | 1.00 |
| Silver Flake (6) | 57.50 |
| | 99.97 |

(7) BAKELITE PKHC Phenoxy Resin available from Union Carbide Corp. of Danbury, CT.
(8) Also known as butyl carbitol acetate and available from Union Carbide Corp.

After the above-noted mixing steps, the resulting dispersion was screen-printed onto a polyester substrate (Melinex 505). The screen was a polyester filament type of −230 mesh size. The screened dispersion was cured in a convention oven for 30 minutes at 140° C. The solvent resistance (i.e., number of rubs of a methylethyl ketone saturated paper towel across the cured pattern necessary to dissolve the cured dispersion) and surface resistivity (i.e., ohms per square at 1 mil) were measured. These results are as follows:

| Cure Condition | MEK Rubs | Surface Resistivity |
|---|---|---|
| 140° C./60 Mins. | >100 | 0.016 |

These results show that the cured PTF dispersion was highly resistant to solvent attack and had a high electrical conductivity, even after curing at low temperatures.

The pencil hardness of this cured PTF dispersion was measured to be 9H, which is relatively very hard. This cured system also was found to be very flexible since no cracking or adhesion loss was observed when either the polyester substrate was hard creased.

EXAMPLE 3

A conductive dispersion was formed by first dissolving a different phenoxy resin in diethylene glycol monoethyl ether acetate using a propeller-agitated mixer and then adding a blocked isocyanate resin, an amine-organo tin complex-based catalyst system and an ethyl acrylate copolymer flow additive. Silver flake was then added into the mixer and resultant mixture was agitated in the propeller-agitated mixer for about one minute. These six components were mixed in a three-roll mill until a fineness of grind of 13 microns was obtained. This ground dispersion was then removed from the mill and tested as discussed below. The six components and their parts by weight are given in the following Table 3.

TABLE 3

| Component | Parts by Weight |
|---|---|
| Phenoxy Resin (1) | 5.63 |
| Diethylene Glycol Monoethyl Ether Acetate (9) | 18.89 |
| Blocked Isocyanate (4) | 8.36 |
| Amine-Organo Tin Catalyst System (10) | 0.34 |
| Ethyl Acrylate/2-Ethylhexyl Acrylate Copolymer Flow Additive (11) | 1.30 |
| Silver Flake (6) | 65.48 |
| | 100.97 |

(9) Also known as carbitol acetate and available from Union Carbide Corp.
(10) Gemini A400 Resin Catalyst System available from Dehomi Corp. of Minneapolis, MN 55441.
(11) MODAFLOW Resin Modifier available from Monsanto Company of St. Louis, MO 63167.

This uncured dispersion was found to have the following properties:

| Viscosity (Brookfield RVT, 20 rpm, Spindle No. 6, 30° C.): | 10,500–13,500 |
|---|---|
| Solids Content: | 79.00% by weight |
| Density: | 19.61 lbs./gal. |
| Shelf Life: | Greater than 6 months |

The long shelf life on this uncured dispersion (i.e., more than six months) is highly desirable for PTF products.

After the above-noted mixing steps, the resulting dispersion was screen printed onto a phenolic-type printed wiring board (FR-2) or an epoxy glass-type printed wiring board (FR-4). The screen used was a polyester filament type of −230 mesh size. The screened dispersion was cured in a convention oven for either 30 minutes at 140° C. or 60 minutes at 125° C. The solvent resistance (i.e., number of rubs of a methylethyl ketone saturated paper towel across the cured pattern necessary to dissolve the cured dispersion) and surface resistivity (i.e., ohms per square at 1 mil) were measured. These results are as follows:

| Cure Condition | MEK Rubs | Surface Resistivity |
|---|---|---|
| 125° C./60 Mins. | >100 | <0.035 |
| 140° C./30 Mins. | >100 | <0.035 |

These results show that the cured PTF dispersion was highly resistant to solvent attack and had a high electrical conductivity, even after curing at low temperatures.

The pencil hardness of this cured PTF dispersion was also measured to be 9H, which is relatively very hard. This cured system also was found to be very flexible since no cracking or adhesion loss was observed when either the phenolic-type or epoxy glass-type boards were bent or flexed. The cured system showed less than 10% change in resistance after a standard tape adhesion test was carried out (i.e., a piece of scotch tape was attached to the surface of the cured pattern and then pulled off in a rapid manner).

EXAMPLE 4

A conductive dispersion was formed by first dissolving a phenoxy resin in a solvent mixture, diethylene glycol monoethyl ether, and dibasic ester solvent using a propeller-agitated mixer and then adding a blocked isocyanate resin, toluene sulfonic acid. Graphite and carbon black were then added into the mixer and resultant mixture was agitated in the propeller-agitated mixer for about one minute. These seven components were mixed in a three-roll mill until a fineness of grind of 13 microns was obtained. This ground dispersion was then removed from the mill and tested as discussed below.

The seven components and their parts by weight are given in the following Table 4.

TABLE 4

| Component | Parts by Weight |
|---|---|
| Phenoxy Resin (1) | 8.47 |
| Diethylene Glycol Monoethyl Ether (2) | 3.97 |
| Dibasic Ester Solvent (3) | 52.92 |
| Blocked Isocyanate (4) | 11.20 |
| Toluene Sulfonic Acid | 0.17 |
| Graphite (12) | 19.11 |
| Carbon Black (13) | 4.17 |
| | 100.00 |

(12) HPN-2 Graphite available from Joseph Dixon Co. of Jersey City, NJ.
(13) Vulcan XC-72R carbon black available from Cabot Corp. of Boston, MA.

This uncured dispersion was found to have the following properties:

| Viscosity (Brookfield RVT, 20 rpm, Spindle No. 6, 30° C.): | Thixotropic |
|---|---|
| Solids Content | 40.3% by weight |
| Density: | 10.1 lbs./gal. |

| Shelf Life (at 25° C.): | <6 months |
|---|---|

The long shelf life on this uncured dispersion is highly desirable for PTF products.

After the above-noted mixing steps, the resulting dispersion was screen printed onto a phenolic-type printed wiring board (FR-2) or an epoxy glass-type printed wiring board (FR-4). The screen used was a polyester filament type of −230 mesh size. The screened dispersion was cured in a convention oven for either 30 minutes at 150° C. or 60 minutes at 140° C. The solvent resistance (i.e., number of rubs of a methyl ethyl ketone saturated paper towel across the cured pattern necessary to dissolve the cured dispersion) and surface resistivity (i.e., ohms per square at 1 mil) were measured. These results are shown as follows:

| Cure Condition | MEK Rubs | Surface Resistivity |
|---|---|---|
| 140° C./60 Mins. | >100 | <60 |
| 150° C./30 Mins. | >100 | <60 |

These results shows that the cured PTF dispersion was highly resistant to solvent attack and has a high electric conductivity for graphite-based PTF, even after curing at low temperatures.

The pencil hardness of this cured PTF dispersion was measured to be 9H, which is relatively very hard. This cured system also was found to be very flexible since no cracking or adhesion loss was observed when either the phenolic-type or epoxy glass-type boards were bent or flexed.

EXAMPLE 5

A conductive dispersion was formed by first dissolving a phenoxy resin in a solvent mixture of diethylene glycol monoethyl ether and dibasic ester solvent using a propeller-agitated mixer and then adding a blocked isocyanate resin, toluene sulfonic acid, alkylolammonium salt of acidic phosphoric acid esters of ketoxime flow additive, and an ethyl acrylate copolymer flow additive. Graphite and carbon black were then added into the mixer and resultant mixture was agitated in the propeller-agitated mixer for about one minute. These nine components were mixed in a three-roll mill until a fineness of grind of 13 microns was obtained. This ground dispersion was then removed from the mill and tested as discussed below. The nine components and their parts by weight are given in the following Table 5:

TABLE 5

| Component | Parts by Weight |
|---|---|
| Phenoxy Resin ① | 8.31 |
| Diethylene Glycol Monoethyl Ether ② | 3.90 |
| Dibasic Ester Solvent ③ | 51.97 |
| Blocked Isocyanate ④ | 11.00 |
| Toluene Sulfonic Acid | 0.16 |
| Alkylolammonium Salt of Acidic Phosphoric Acid Esters of Ketoxime Flow Additive ⑭ | 0.90 |
| Ethyl Acrylate/2-Ethylhexyl Acrylate Copolymer Flow Additive ⑪ | 0.90 |
| Graphite ⑫ | 18.77 |
| Carbon Black ⑬ | 4.09 |

TABLE 5-continued

| Component | Parts by Weight |
|---|---|
| | 100.00 |

⑭ Bykanol-W available from BYK-Chemie, USA of 524 South Cherry Street, Wallingford, CT 06492.

This uncured dispersion was found to have the following properties:

| Viscosity (Brookfield RVT, 20 rpm Spindle No. 6, 30° C.): | Thixotropic |
|---|---|
| Solids Content: | 41.1% by weight |
| Density: | 10.1 lbs./gal. |
| Shelf Life (at 24° C.): | Greater than 6 months |

The long shelf life of this uncured dispersion is highly desirable for PTF products.

After the above-noted mixing steps, the resulting dispersion was printed onto a phenolic-type printed wiring board (FR-2) or an epoxy glass-type printed wiring board (FR-4 and FR-5). The screens used were polyester filament type of 170-230 mesh sizes. The screened dispersion was cured in a covention oven for either 60 minutes at 140° C. or 30 minutes at 150° C. The solvent resistance (i.e., number of rubs of a methylethyl ketone saturated paper towel across the cured pattern necessary to dissolve the cured dispersion) and surface resistivity (i.e., ohms per square at 1 mil) were measured. These results are shown as follows:

| Cure Condition | MEK Rubs | Surface Resistivity |
|---|---|---|
| 140° C./60 Mins. | >100 | <60 |
| 150° C./30 Mins. | >100 | <60 |

These results show that the cured PTF dispersion was highly resistant to solvent attack and has a high electrical conductivity for graphite-based PTF product, even after curing at low temperatures.

The pencil hardness of this cured PTF dispersion was measured to be 9H, which is relatively very hard. This cured system also was found to be very flexible since no cracking or adhesion loss was observed when either the phenolic-type or epoxy glass-type boards were bent or flexed.

EXAMPLE 6

A conductive dispersion was formed by first dissolvinq a phenoxy resin in diethylene glycol monoethyl ether acetate using a propeller-agitated mixer and then adding a blocked isocyanate resin, toluene sulfonic acid. Graphite and carbon black were then added into the mixer and resultant mixture was agitated in the propeller-agitated mixer for about one minute. These six components were mixed in a three-roll mill until a fineness of grind of 13 microns was obtained. This ground dispersion was then removed from the mill and tested as discussed below. The six components and their parts by weight are given in the following Table 6:

TABLE 6

| Component | Parts by Weight |
|---|---|
| Phenoxy Resin ① | 11.27 |
| Diethylene Glycol Monobutyl Ether Acetate ⑤ | 47.71 |
| Blocked Isocyanate ④ | 14.90 |

TABLE 6-continued

| Component | Parts by Weight |
|---|---|
| Toluene Sulfonic Acid | 0.32 |
| Graphite ⑫ | 21.17 |
| Carbon Black ⑬ | 4.63 |
| | 100.00 |

This uncured dispersion was found to have the following properties:

| | |
|---|---|
| Viscosity (Brookfield RVT, 20 rpm Spindle No. 6, 30° C.): | Thixotropic |
| Solids Content: | 48.6% by weight |
| Density: | 1.2 g/ml |
| Shelf Life: | Greater than 6 months |

The long shelf life of this uncured dispersion is highly desirable for PTF products.

After the above-noted mixing steps, the resulting dispersion was printed onto a phenolic-type printed wiring board (FR-2) or an epoxy glass-type printed writing board (FR-4). The screens used were polyester filament type of 170-230 mesh size. The screened dispersion was cured in a convention oven for either 30 minutes at 150° C. or 60 minutes at 140° C. The solvent resistance (i.e., number of rubs of a methyl ethyl ketone saturated paper towel across the cured pattern necessary to dissolve the cured dispersion) and surface resistivity (i.e., ohms per square at 1 mil) were measured. These results are shown as follows:

| Cure Condition | MEK Rubs | Surface Resistivity |
|---|---|---|
| 140° C./60 Mins. | >100 | <60 |
| 150° C./30 Mins. | >100 | <60 |

These results show that the cured PTF dispersion was highly resistant to solvent attack and has a high electrical conductivity for graphite-based PTF products, even after curing at low temperatures.

The pencil hardness of this cured PTF dispersion was measured to be 9H, which is relatively very hard. This cured system also was found to be very flexible since no cracking or adhesion loss was observed when either the phenolic-type or epoxy glass-type boards were bent or flexed.

What is claimed is:

1. A method of curing a polymer thick film on a substrate comprising the steps of:
   (1) providing a polymer thick film composition comprising:
      (a) a resin system comprising an admixture of:
         (i) about 4.50 parts to about 12 parts by weight of at least one phenoxy resin; and
         (ii) about 6 parts to about 15.5 parts by weight of at least one blocked isocyanate resin; and
      (b) a conductive material selected from the group consisting of:
         (i) about 50 parts to about 70 parts by weight silver flake; and
         (ii) an admixture of about 15 to about 25 parts by weight graphite and about 3 parts to about 6 parts by weight of carbon black.
   (2) applying said composition to a substrate; and
   (3) thermally curing said composition onto said substrate.

2. The method of claim 1 wherein said applying step 2 is a screen-printing operation.

3. The method of claim 1 wherein said curing step is carried out at a temperature from about 120° C. to about 150° C. for a period of time from about 90 minutes to about 20 minutes.

4. A substrate having a curved conductive polymer thick film coating thereon which comprises a cured admixture of:
   (a) a cured resin system comprising a reaction product of:
      (i) about 4.50 parts to about 12 parts by weight of at least one phenoxy resin; and
      (ii) about 6 parts to about 15.5 parts by weight of at least one blocked isocyanate resin;
   (b) a conductive material selected from the group consisting of:
      (i) about 50 parts to about 70 parts by weight silver flakes; and
      (ii) an admixture of about 15 to about 25 parts by weight graphite and about 3 parts to about 6 parts by weight carbon black.

5. The coated substrate of claim 4 wherein said substrate is flexible.

6. The coated substrate of claim 5 wherein said substrate is rigid.

* * * * *